(12) United States Patent
Maszara et al.

(10) Patent No.: US 6,184,112 B1
(45) Date of Patent: Feb. 6, 2001

(54) METHOD OF FORMING A MOSFET TRANSISTOR WITH A SHALLOW ABRUPT RETROGRADE DOPANT PROFILE

(75) Inventors: Witold P. Maszara, Morgan Hill; Srinath Krishnan, Campbell; Shekhar Pramanick, Fremont, all of CA (US)

(73) Assignee: Advanced Micro Devices, Inc., Sunnyvale, CA (US)

( * ) Notice: Under 35 U.S.C. 154(b), the term of this patent shall be extended for 0 days.

(21) Appl. No.: 09/204,998

(22) Filed: Dec. 2, 1998

(51) Int. Cl.[7] .................................................. H01L 21/425
(52) U.S. Cl. ............................ 438/528; 438/162; 438/181
(58) Field of Search ...................... 257/49, 345; 438/199, 438/528, 162, 142, 197, 151, 181

(56) References Cited

U.S. PATENT DOCUMENTS

| | | | |
|---|---|---|---|
| 4,463,492 | * 8/1984 | Maeguchi | 29/576 |
| 5,254,484 | * 10/1993 | Hefner et al. | 437/24 |
| 5,593,907 | * 1/1997 | Anjum et al. | 437/35 |
| 5,735,949 | * 4/1998 | Mantl et al. | 117/8 |
| 5,841,170 | * 11/1998 | Adan et al. | 257/345 |
| 5,908,307 | * 6/1999 | Talwar et al. | 438/199 |
| 5,962,869 | * 10/1999 | Yamazaki et al. | 257/49 |
| 5,973,363 | * 10/1999 | Staab et al. | 257/347 |
| 6,017,782 | * 1/2000 | Batra et al. | 438/158 |
| 6,090,648 | * 7/2000 | Reedy et al. | 438/155 |

OTHER PUBLICATIONS

"Material and Electrical Properties of Ultra–Shallow p[+] –n Junctions Formed by Low–Energy Ion Implantation and Rapid Thermal Annealing", Shin Nam Hong, etc., IEEE, vol. 38, No. 3, Mar. 1991, pp. 476–486.

"Silicon Processing For the VLSI Era", Volume I: Process Technology, Stanley Wolf, etc., Lattice Press, date unknown, pp. 305–306.

* cited by examiner

*Primary Examiner*—Matthew Smith
*Assistant Examiner*—Robert A. Hullinger
(74) *Attorney, Agent, or Firm*—Skjerven Morrill MacPherson LLP; Edward C. Kwok

(57) ABSTRACT

In accordance with the present invention, an amorphous layer is formed in a crystalline substrate (e.g., the channel region of a MOSFET transistor) by, for example, implanting ions of an inert specie such as germanium. A dopant is implanted so that it overlaps with the amorphous layer. Subsequently, low temperature recrystallization of the amorphous layer leads to an abrupt retrograded layer of active dopant in the channel region of the MOSFET. This retrograded dopant layer could be formed before or after the formation of the gate electrode.

9 Claims, 4 Drawing Sheets

METHOD OF FORMING A MOSFET TRANSISTOR WITH A SHALLOW ABRUPT RETROGRADE DOPANT PROFILE

FIELD OF THE INVENTION

The present invention relates to semiconductor processing technology, and in particular, the present invention relates to a method of forming a MOSFET transistor with a shallow abrupt retrograde dopant profile.

BACKGROUND OF THE INVENTION

"A retrograde dopant profile" refers to a dopant profile which has a lower dopant concentration at a surface of an object than in the body of the object. Retrograde dopant profiles are known to be useful in the channel region of a metal-oxide-silicon field effect transistor ("MOSFET") to increase mobility and drive current in the channel region. However, there is an increasing need, as feature sizes of circuits become continuously smaller, to increase mobility and drive current in the channel region, particularly in short channel devices.

Since the advent of semiconductor devices, the minimum feature size has continuously decreased. In order to further decrease the minimum feature size, which is already well into the sub-micron realm, it is important to not only reduce the horizontal dimensions of the devices, but to also reduce the vertical dimensions such as, for example, the retrograde dopant profiles described above.

Conventionally, retrograde dopant profiles may be formed by implanting dopant ions into a semiconductor wafer so that the peak concentration is below the surface of the wafer. However, there is a need to form retrograde dopant profiles which are shallower and more abrupt in order to accommodate the continuously decreasing depths.

Accordingly, there is a need for a method of forming a more abrupt and shallow retrograde dopant profile than conventionally known.

SUMMARY OF THE INVENTION

In accordance with the present invention, an amorphous layer is formed in a crystalline substrate (e.g., in the channel region of a MOSFET) by, for example, implanting ions of an inert specie such as germanium. The amorphous layer is formed a certain distance below the surface, thus leaving a crystalline layer between the amorphous layer and the surface of the crystalline substrate. A dopant is implanted into the crystalline substrate in the channel region before or after the amorphous layer is formed to form a doped region. The doped region overlaps part or all of the amorphous layer. Next, the amorphous layer is recrystallized.

The recrystallization of the amorphous layer activates many ions of part of the doped region overlapping with the amorphous layer. In contrast, the recrystallization annealling does not cause significant activation of ions in the regions that were not amorphized. Therefore, an abrupt retrograde dopant profile can be created at or near the boundary of the recrystallized layer and the crystalline layer in the channel region of the MOSFET.

The shallow abrupt retrograde dopant profile formed in the channel region of a MOSFET controls short channel effects and increases mobility in the channel region.

DETAILED DESCRIPTION OF THE INVENTION

In the following description, similar or the same elements of the various drawings are referred to with the same reference symbols.

In accordance with an embodiment of this invention, a shallow abrupt retrograde dopant profile is created as follows.

Figure 1:
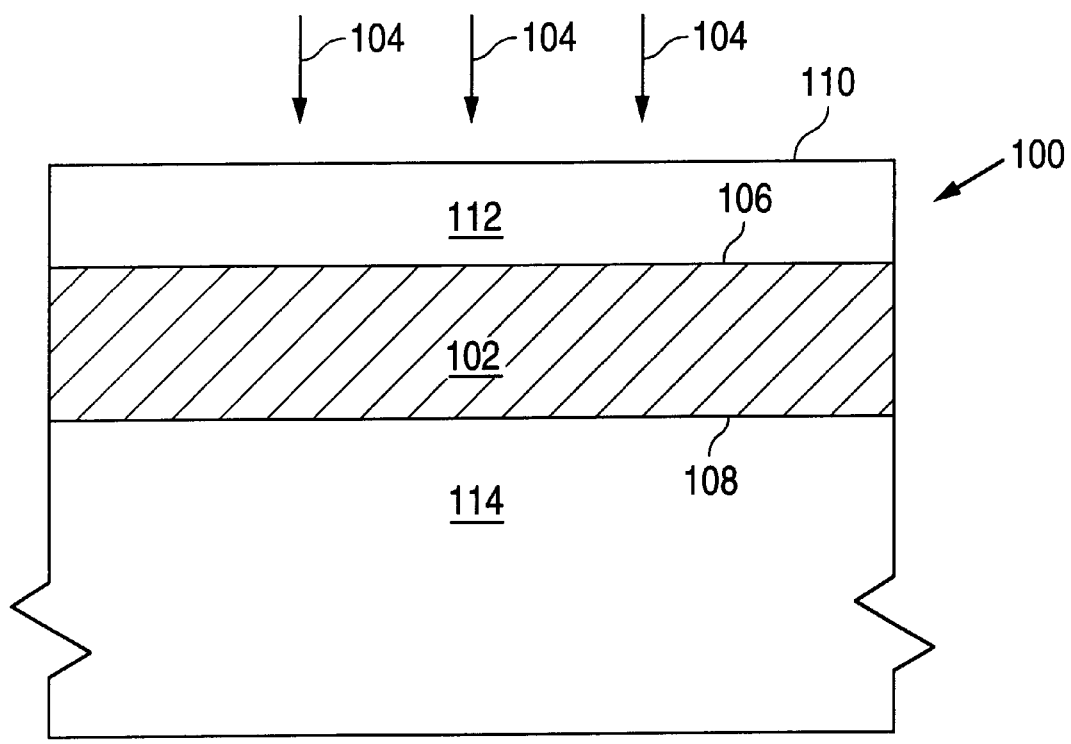
FIG. 1 shows a substrate having an amorphous region bounded by crystalline regions.

An amorphous layer 102 (represented by the section of FIG. 1 filled in with forward diagonal lines) is formed underneath a surface 110 of substrate 100 by implanting heavy ions 104 of an electrically inactive species such as silicon or germanium. The use of germanium ions is particularly advantageous because the germanium ions are relatively heavy, and thus a lower dose is required to form an amorphous layer.

The upper A/C interface 106 is generated at approximately the same depth as the desired abrupt retrograde dopant profile to be formed. The depths of the upper and lower A/C interfaces 106 and 108 is a function of the dose, energy, and type of ions 104. A shallow crystalline layer 112 is above upper A/C interface 106 because the relatively low quantity of silicon or germanium atoms is not enough to amorphize the crystalline structure of substrate 100 in that layer. For the same reasons, a deep crystalline layer 114 may be underneath lower A/C interface 108.

While the depth of the abrupt retrograde profile to be formed depends on the particular operation and type of device desired, an example of the implantation energies for germanium ions may be in the range from 100 keV to 200 keV with ion doses of approximately from 2E14 $cm^{-2}$ to 5E14 $cm^{-2}$. An energy of 150 keV with a germanium ion dose of 4E14 $cm^{-2}$, for example, will produce amorphous layer 102 with upper and lower A/C interface 106 and 108 depths of approximately 30 nm (nanometers) and 180 nm, respectively. Where lighter ions are used, the dose is, of course, increased and the implant energy is decreased in order to create a similar amorphous layer. The specific doses and energies of ions 104 required to generate amorphous layer 102 at any depth are well known and understood by those of ordinary skill in the art. A standard ion implanter may be used to implant ions 104 to the desired depth and concentration to generate amorphous layer 102. The amorphizing ion implantation is conducted at ambient or reduced temperatures, and may be conducted at, for example, 25° C.

Figure 2A:
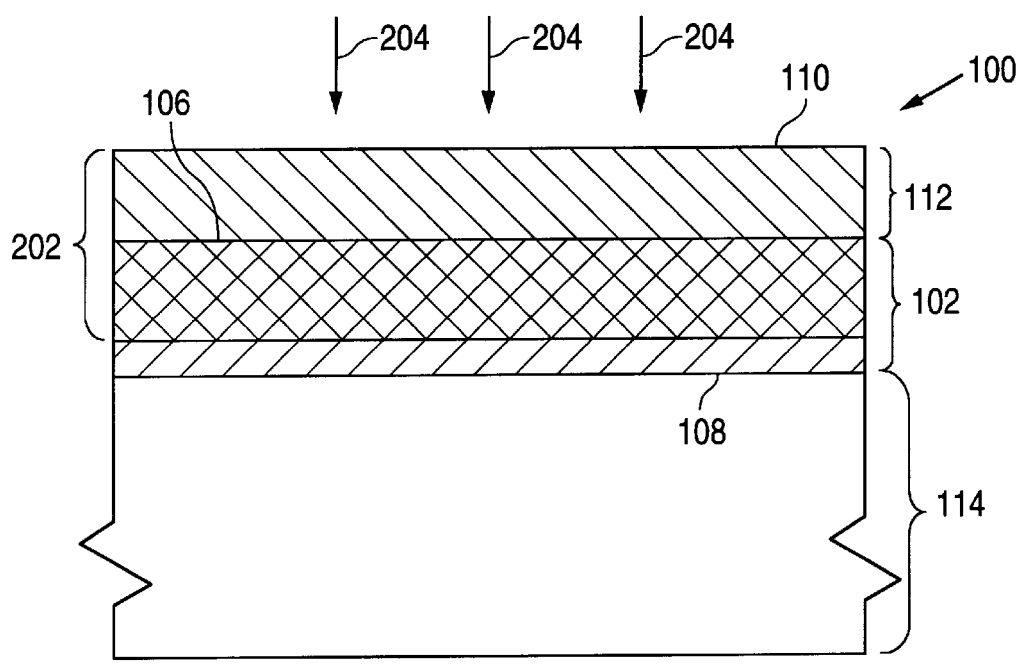
FIG. 2A shows the substrate of FIG. 1 after the formation of a dopant region.

FIG. 2A shows substrate 100 after a subsequent processing step described below. Dopant species ions 204 (FIG. 2A)

are implanted into substrate 100 forming a doped region 202 represented by the section having backward diagonal lines perpendicular to the forward diagonal lines defining amorphous region 102. Doped region 202 must overlap at least a portion of amorphous layer 102. This overlap is represented by crossed diagonal lines.

The ions 204 implanted into substrate 100 may be, for example, boron, $BF_2$, arsenic, or phosphorous, depending on the conductivity type desired in region 202. If boron ions are implanted as ions 204, a typical implant energy and dose are respectively approximately 15 to 25 keV and 1 to 5 E13 $cm^{-2}$.

Figure 2B:
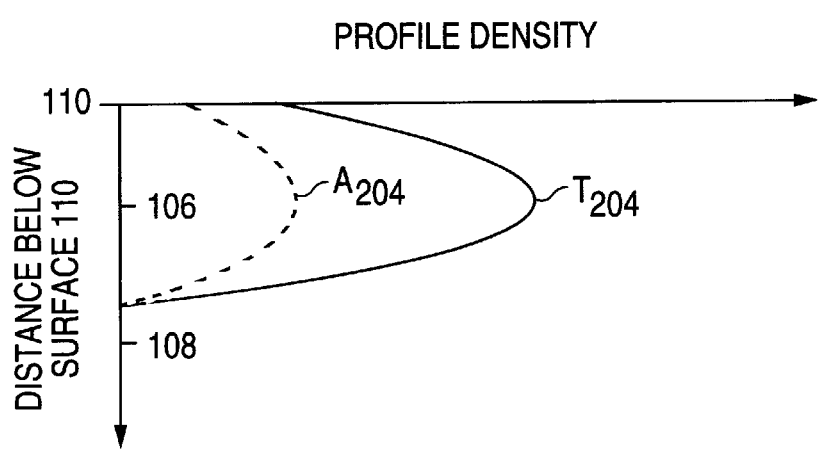
FIG. 2B shows the chemical and electrically active dopant profiles of the substrate of FIG. 2A.

Referring to FIG. 2B, some of ions 204 are active after implantation. The active dopant density profile caused by ions 204 is represented by the dotted line $A_{204}$. The total dopant density profile caused by ions 204 is represented by solid line $T_{204}$. Although specific profiles $A_{204}$ and $T_{204}$ are shown, the present invention works with many dopant profiles of ions 204.

Furthermore, implanting of ions 104 does not need to be done before implanting of ions 204 to obtain the profiles of FIG. 2B.

After ions 204 are implanted, the amorphous layer 102 is recrystallized by heating substrate 100 to a temperature sufficient to recrystallize the amorphous layer 102 without activating significant ions in crystalline layer 112. This low temperature anneal may typically occur in a nitrogen environment. If substrate 100 is primarily silicon, this temperature ranges from 550° C. to 650° C. (e.g., 600° C.). Typically, a 600° C. anneal will recrystallize an amorphous layer at approximately 10 Å per second, and thus a 50 nm amorphous layer, bounded on both sides with a crystalline layer, will recrystallize in 25 seconds since recrystallization occurs from both sides of the amorphous layer 102.

Figure 3A:
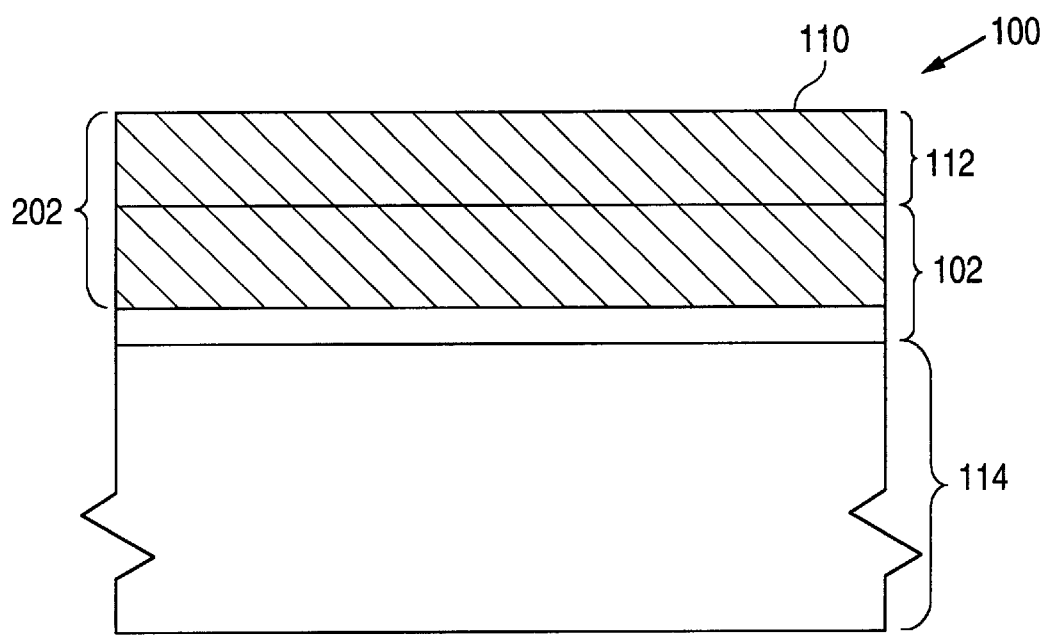
FIG. 3A shows the substrate of FIG. 2A after recrystallization of the amorphous layer to form a recrystallized layer.
Figure 3B:
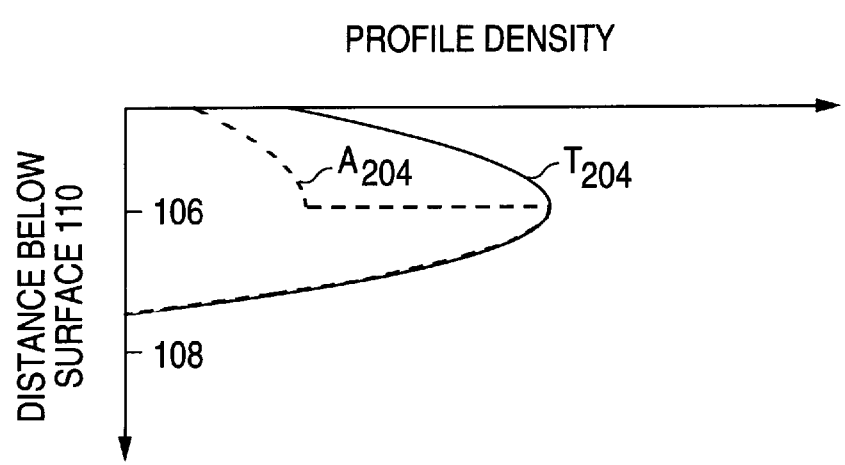
FIG. 3B shows the chemical and electrically active dopant profiles of the substrate of FIG. 3A.

FIG. 3A shows substrate 100 after recrystallization of amorphous layer 102 to form recrystallized layer 102'. FIG. 3B shows the active dopant profiles after the temperature exposure. Substantially all of the ions 204 in the recrystallized layer 102' are activated when the amorphous layer 102 is recrystallized. On the other hand, only an insignificant amount of inactive dopants in the crystalline layer 112 are activated as a result of the temperature exposure. Therefore, there is an extremely steep retrograded active dopant profile $A_{204}$ as shown in FIG. 3B.

Note that profile $A_{204}$ of FIG. 3B only represents the dopant profile due to ions 204 and does not show dopant profiles caused by other ions. However, even considering other ion implantations (e.g., deep p-well implant ions), the abrupt change in profile $A_{204}$ at the boundary 106 contributes to an abrupt change in the total active dopants at the boundary 106.

With the shallow abrupt retrograde dopant profile described above, no further annealing is necessary. Additional annealing at higher temperatures, e.g., 700° C. to 900° C., will activate the dopant species within crystalline region 112, particularly near the peak of the concentration, thereby degrading the abruptness of the active retrograde dopant profile $A_{204}$. For example, conventionally, an additional rapid thermal annealing step is performed at a high temperature, for example 1000° C. to 1100° C., to activate other implanted dopant species. Such high temperature annealings should be avoided. Consequently, subsequent processing steps of substrate 100 are performed at a strictly controlled thermal budget that is approximately equal to or below the temperature used in the low temperature annealing process.

The shallow abrupt junction, as described above, may be used in any other device in which shallow abrupt retrograde dopant profiles are desirable. For example, one application is in the channel region of an npn MOSFET ("nMOS") transistor as described with reference to FIGS. 4 and 5.

Figure 4:
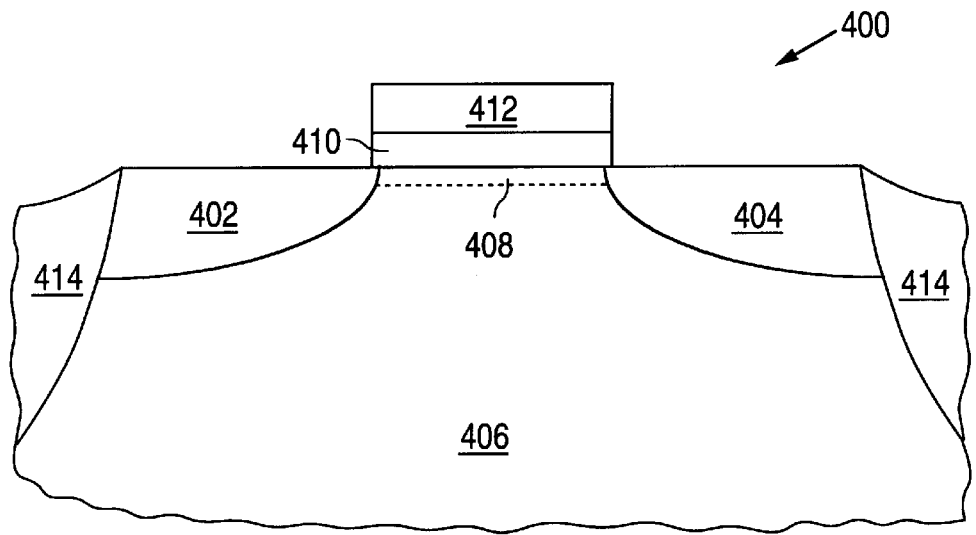
FIG. 4 is a cross-sectional view of an nMOS transistor which may be provided with a shallow abrupt retrograde dopant profile in the channel region after deposition of a gate.

FIG. 4 shows an nMOS transistor 400 having an n-type source region 402, an n-type drain region 404, a deep p-well body region 406, a channel region 408, a gate dielectric layer 410, and a gate electrode 412. The nMOS transistor may be isolated with trench isolation regions 414. The formation of the shallow abrupt retrograde profile in the channel region 408 is done after processes which require processing temperature of approximately 600° C. or more (e.g., source, channel and gate activation anneal and silicidation).

The implanting of ions 104 and 204 may be performed through gate electrode 412 and gate dielectric layer 410 and into channel region 408. If the gate electrode 412 is approximately 150 nm thick polysilicon, the gate dielectric layer 410 is 2.5 nm thick silicon dioxide, ions 104 are germanium ions, and ions 204 are boron ions, then a typical implant dose for ions 104 is 1E15 $cm^{-2}$ at 400 keV, and a typical implant dose for ions 204 is 5E13 $cm^{-2}$ at 60 keV.

Figure 5:
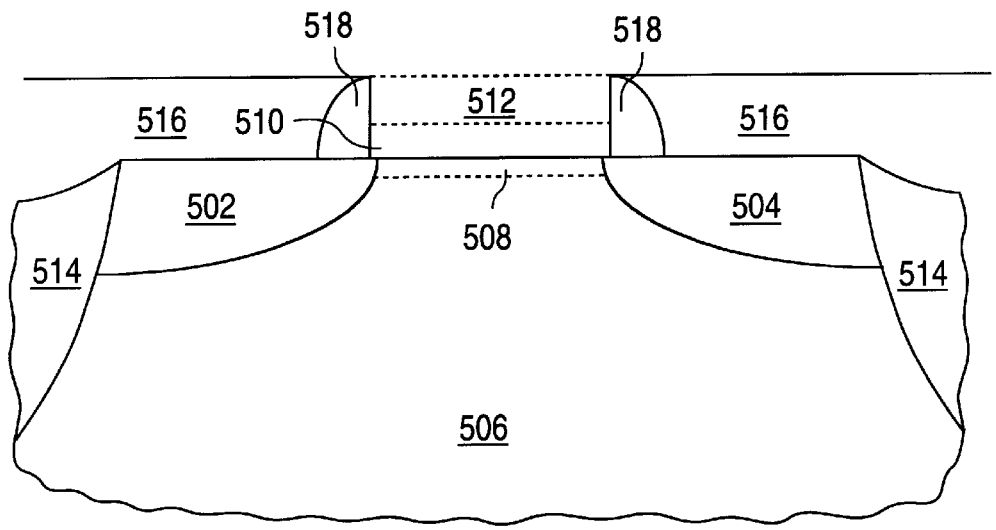
FIG. 5 is a cross-sectional view of an nMOS transistor which may be provided with a shallow abrupt retrograde dopant profile in the channel region before deposition of a gate.

FIG. 5 shows an nMOS transistor 500 having an n-type source region 502, an n-type drain region 504, a deep p-well body region 506, a channel region 508, a planarized layer 516 and side spacers 518. Sacrificial gate electrode 512 is represented by dotted lines and has been removed after planarization of layer 516. The nMOS transistor 500 may be isolated with trench isolation regions 514. The formation of the shallow abrupt retrograde profile in the channel region 508 is done after processes which require processing temperature of approximately 6000C or more.

The implanting of ions 104 and 204 may be performed directly into channel region 508. If ions 104 are germanium ions and ions 204 are boron ions, then a typical implant dose for ions 104 is 5E14 $cm^{31\ 2}$ at 80 keV, and a typical implant dose for ions 204 is 5E13 $cm^{-2}$ at 15 keV. After the recrystallization anneal, gate dielectric 510 is deposited and gate electrode 512 is formed at relatively low temperatures using, for example, the damascene process.

Although the above process is described as applied to an nMOS transistor, those of ordinary skill will recognize that the formation of the shallow abrupt retrograde dopant profile is useful in a wide variety of application such as in the channel region of a pMOS transistor. In a pMOS transistor, for example, ions 204 are n-type.

Although the principles of the present invention have been described with reference to specific embodiments, one skilled in the art will recognize that various substitutions and modifications may be made after having reviewed this disclosure. The specific embodiments described above are illustrative only, and not limiting. The invention is defined by the following claims.

We claim:

1. A method comprising:
    forming an amorphous layer in a channel region of a MOSFET, the amorphous layer lying below a crystalline layer of the channel region;
    implanting a dopant into the channel region to form a doped region, wherein after forming and implanting, the doped region overlaps at least portions of the crystalline layer and the amorphous layer;
    recrystallizing the amorphous layer after forming and implanting under a temperature insufficient to significantly activate the dopant in said crystalline layer; and
    complete processing of said MOSFET without exceeding said temperature.

2. The method of claim 1, wherein recrystallizing comprises heating the amorphous layer.

3. The method of claim 1, wherein forming the amorphous layer comprises implanting an inert ion species into the channel region of the MOSFET.

4. The method of claim 3, wherein implanting the inert ion species comprises implanting germanium ions.

5. The method of claim 1, wherein implanting the dopant occurs before forming the amorphous layer.

6. The method of claim 1, wherein after implanting the dopant and forming the amorphous layer, the dopant has a peak concentration within the amorphous layer.

7. The method of claim 1, wherein implanting the dopants comprises implanting boron.

8. The method of claim 1, wherein implanting the dopant into the channel region comprises implanting the dopant through a gate electrode, through a gate dielectric, and into the channel region.

9. The method of claim 1, wherein implanting the dopant into the channel region comprises implanting the dopant directly into the channel region.

* * * * *